(12) United States Patent
Lee et al.

(10) Patent No.: US 9,570,613 B2
(45) Date of Patent: Feb. 14, 2017

(54) STRUCTURE AND FORMATION METHOD OF FINFET DEVICE

(71) Applicant: Taiwan Semiconductor Manufacturing Co., Ltd, Hsin-Chu (TW)

(72) Inventors: Kai-Hsuan Lee, Hsinchu (TW); Cheng-Yu Yang, Xihu Township, Changhua County (TW); Hsiang-Ku Shen, Hsinchu (TW); Han-Ting Tsai, Kaoshiung (TW); Yimin Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/622,180

(22) Filed: Feb. 13, 2015

(65) Prior Publication Data
US 2016/0240651 A1    Aug. 18, 2016

(51) Int. Cl.
*H01L 29/78* (2006.01)
*H01L 29/161* (2006.01)
*H01L 29/36* (2006.01)
*H01L 21/02* (2006.01)
*H01L 29/66* (2006.01)
*H01L 29/49* (2006.01)
(Continued)

(52) U.S. Cl.
CPC ......... *H01L 29/785* (2013.01); *H01L 21/0223* (2013.01); *H01L 21/3065* (2013.01); *H01L 21/76224* (2013.01); *H01L 29/161* (2013.01); *H01L 29/36* (2013.01); *H01L 29/495* (2013.01); *H01L 29/66431* (2013.01); *H01L 29/66795* (2013.01); *H01L 29/802* (2013.01); *H01L 29/165* (2013.01)

(58) Field of Classification Search
CPC ............. H01L 29/785; H01L 29/802; H01L 29/66431; H01L 29/66795; H01L 29/36; H01L 29/161; H01L 29/495; H01L 21/0223; H01L 21/3065; H01L 21/76224
USPC .... 257/E29.242, E29.255, E29.264, E21.09, 257/E21.409, E23.011; 438/197, 289, 438/300, 425, 682
See application file for complete search history.

(56) References Cited

U.S. PATENT DOCUMENTS

| | | | |
|---|---|---|---|
| 8,816,428 B1* | 8/2014 | Miller | H01L 21/762 257/329 |
| 2009/0026616 A1* | 1/2009 | Dertinger | B81B 7/0006 257/751 |

(Continued)

FOREIGN PATENT DOCUMENTS

| | | |
|---|---|---|
| JP | 2013-197596 A | 9/2013 |
| KR | 10-2014-0110704 A | 9/2014 |

*Primary Examiner* — Dao H Nguyen
(74) *Attorney, Agent, or Firm* — Birch, Stewart, Kolasch & Birch, LLP

(57) ABSTRACT

Structures and formation methods of a semiconductor device structure are provided. The semiconductor device structure includes a semiconductor substrate and a fin structure over the semiconductor substrate. The semiconductor device structure also includes a gate stack over a portion of the fin structure, and the fin structure includes an intermediate portion under the gate stack and upper portions besides the intermediate portion. The semiconductor device structure further includes a contact layer over the fin structure. The contact layer includes a metal material, and the upper portions of the fin structure also include the metal material.

20 Claims, 18 Drawing Sheets

(51) Int. Cl.
*H01L 21/3065* (2006.01)
*H01L 21/762* (2006.01)
*H01L 29/80* (2006.01)
*H01L 29/165* (2006.01)

(56) References Cited

U.S. PATENT DOCUMENTS

| | | |
|---|---|---|
| 2011/0068407 A1 | 3/2011 | Yeh et al. |
| 2012/0032275 A1* | 2/2012 | Haran ............... H01L 21/28518 257/401 |
| 2013/0249003 A1 | 9/2013 | Oh et al. |
| 2014/0008700 A1* | 1/2014 | Rachmady ........ H01L 29/66431 257/192 |
| 2014/0035000 A1* | 2/2014 | Ontalus ................ H01L 29/665 257/192 |
| 2014/0203370 A1* | 7/2014 | Maeda .................. H01L 29/785 257/365 |
| 2014/0252475 A1 | 9/2014 | Xu |
| 2014/0346612 A1* | 11/2014 | Adam ............... H01L 21/76205 257/397 |
| 2015/0147861 A1* | 5/2015 | Park .................. H01L 29/66795 438/283 |
| 2015/0162405 A1* | 6/2015 | Yang .................. H01L 29/1045 257/76 |

* cited by examiner

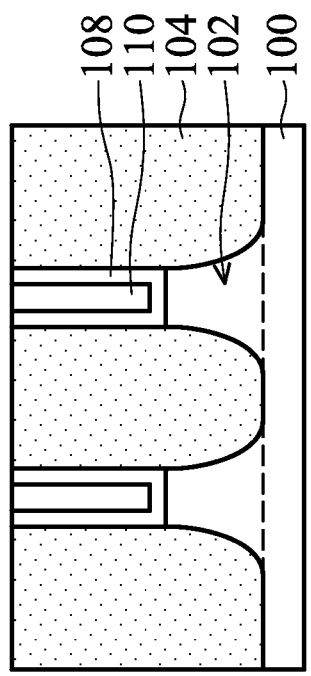
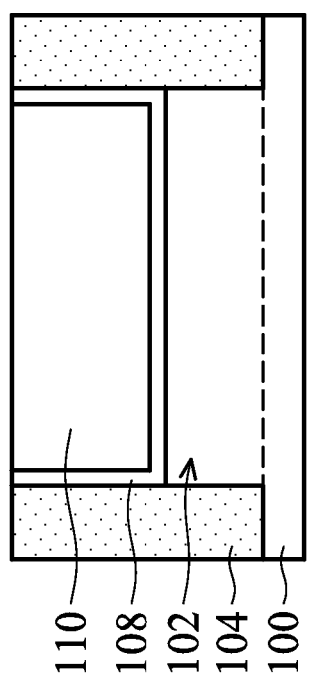
FIG. 1D-1
FIG. 1D-2

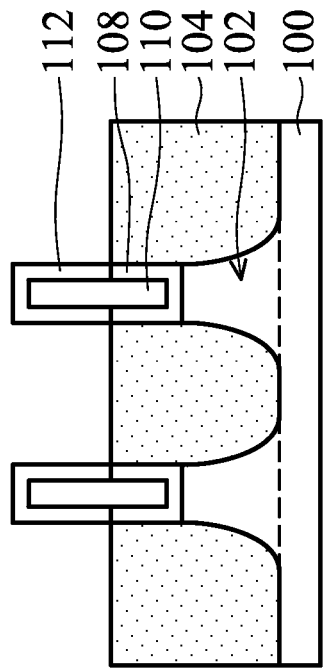
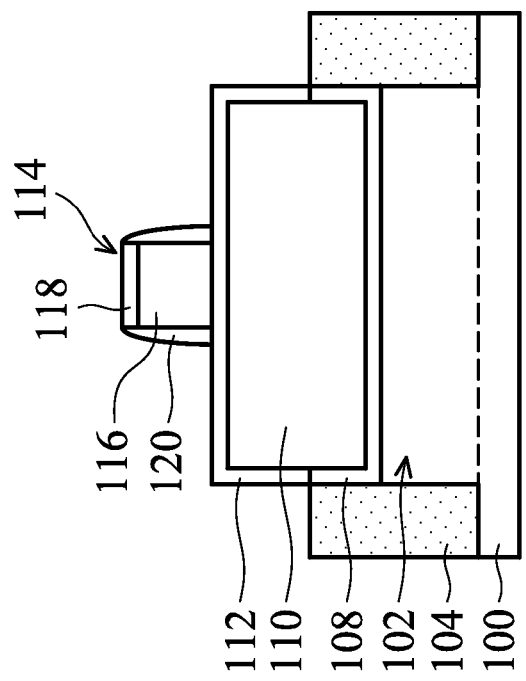
FIG. 1H-2
FIG. 1H-1

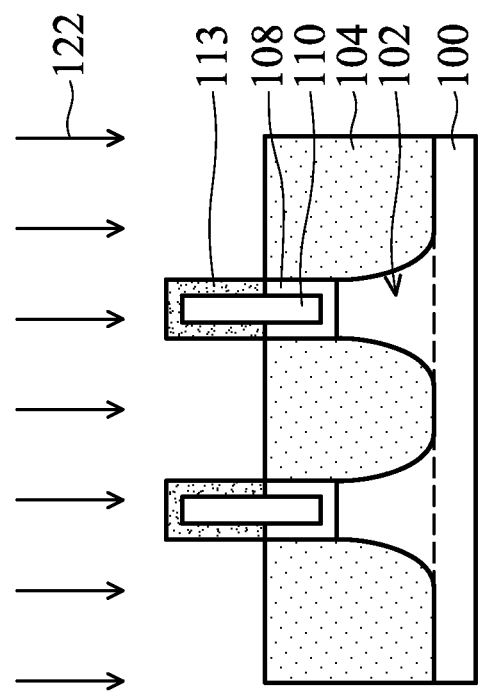
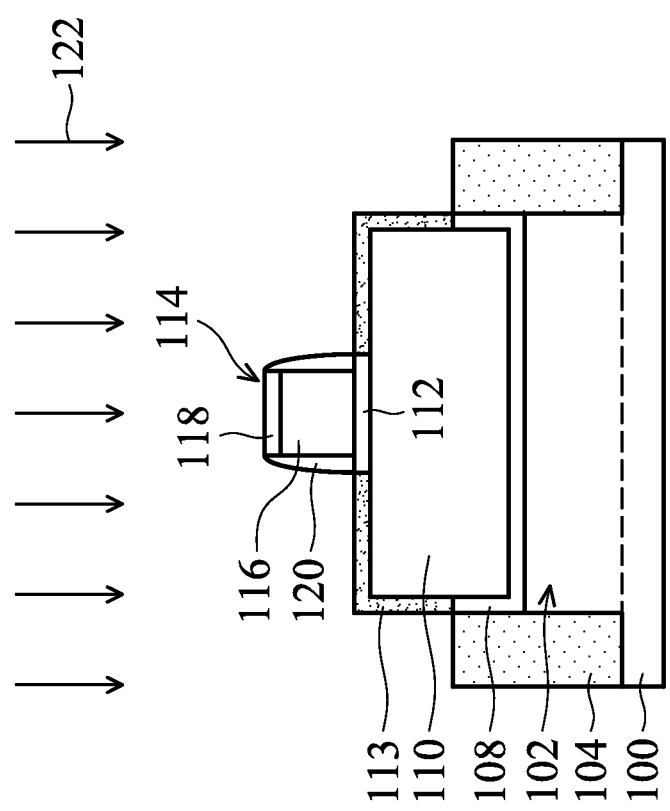
FIG. 1I-2
FIG. 1I-1

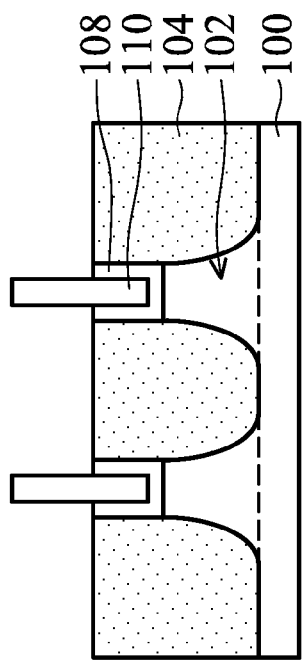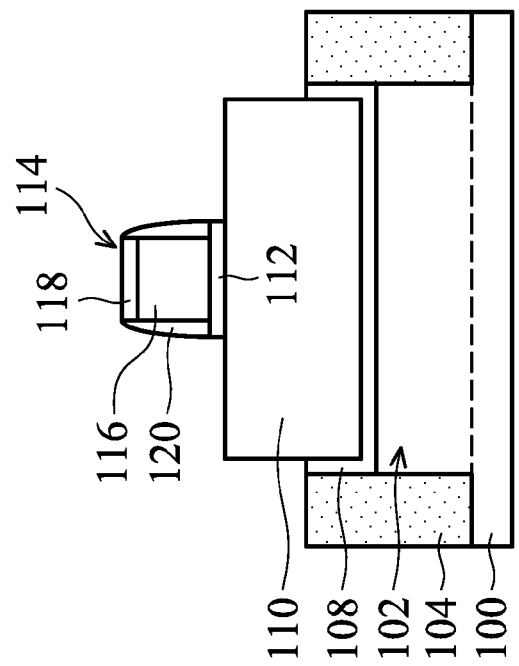
FIG. 1J-1
FIG. 1J-2

STRUCTURE AND FORMATION METHOD OF FINFET DEVICE

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size has decreased. This scaling-down process generally provides benefits by increasing production efficiency and lowering associated costs.

Despite groundbreaking advances in materials and fabrication, scaling planar devices such as a metal-oxide-semiconductor field effect transistor (MOSFET) device has proven challenging. To overcome these challenges, circuit designers look to novel structures to deliver improved performance, which has resulted in the development of three-dimensional designs, such as fin-like field effect transistors (FinFETs). The FinFET is fabricated with a thin vertical "fin" (or fin structure) extending up from a substrate. The channel of the FinFET is formed in this vertical fin. A gate is provided over the fin to allow the gate to control the channel from multiple sides. Advantages of the FinFET may include a reduction of the short-channel effect, reduced leakage, and higher current flow.

However, since feature sizes continue to decrease, fabrication processes continue to become more difficult to perform. Therefore, it is a challenge to form a reliable semiconductor device including the FinFET.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A-2 to 1Q-2 are cross-sectional views of various stages of a process for forming a semiconductor device structure, in accordance with some embodiments.

FIG. 2 is a top view of a semiconductor device structure, in accordance with some embodiments.

DETAILED DESCRIPTION

Figures 1, 1A, 2:
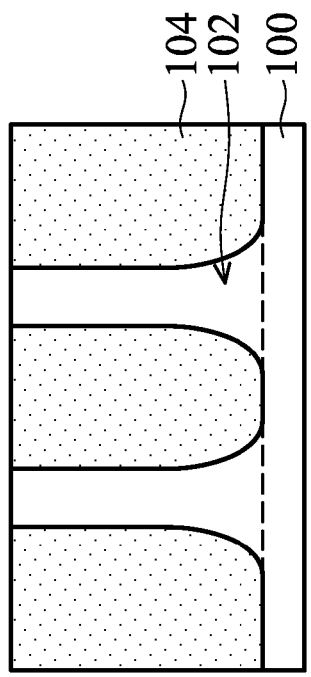
Figures 1, 1A:
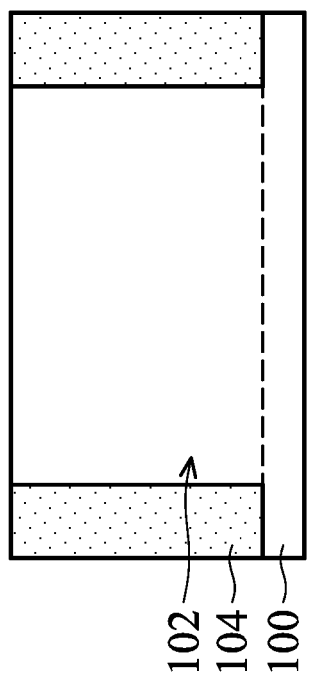
FIGS. 1A-1 to 1Q-1 are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1 to 1Q-1 are cross-sectional views of various stages of a process for forming a semiconductor device structure, in accordance with some embodiments. FIGS. 1A-2 to 1Q-2 are cross-sectional views of various stages of a process for forming a semiconductor device structure, in accordance with some embodiments. Additional operations can be provided before, during, and/or after the stages described in FIGS. 1A-1 to 1Q-1 and FIGS. 1A-2 to 1Q-2. Some of the stages that are described can be replaced or eliminated for different embodiments. Additional features can be added in the semiconductor device structure. Some of the features described below can be replaced or eliminated for different embodiments.

FIG. 2 is a top view of a semiconductor device structure that includes one or more FinFET devices, in accordance with some embodiments. In some embodiments, the semiconductor device structure includes one or more fin structures 102 and one or more gate stacks 114. In some embodiments, FIGS. 1A-1 to 1Q-1 are cross-sectional views of various process stages taken along line 1-1 in FIG. 2. In some embodiments, FIGS. 1A-2 to 1Q-2 are cross-sectional views of various process stages taken along line 2-2 in FIG. 2.

As shown in FIGS. 1A-1 and 1A-2, recesses are formed in a semiconductor substrate 100 to form multiple fin structures 102 between the recesses, in accordance with some embodiments. In some embodiments, photolithography and etching processes are used to form the recesses. In some embodiments, the semiconductor substrate 100 is a bulk semiconductor substrate, such as a semiconductor wafer. For example, the semiconductor substrate 100 is a silicon wafer. The semiconductor substrate 100 may include silicon or other elementary semiconductor materials such as germanium. In some other embodiments, the semiconductor substrate 100 includes a compound semiconductor. The compound semiconductor may include gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

As shown in FIGS. 1A-1 and 1A-2, isolation features 104 are formed in the recesses to surround the fin structures 102, in accordance with some embodiments. The isolation features 104 are used to define and/or electrically isolate various device elements formed in and/or over the semiconductor substrate 100. In some embodiments, the isolation features 104 includes shallow trench isolation (STI) features, local oxidation of silicon (LOCOS) features, another suitable isolation feature, or a combination thereof. In some embodiments, the isolation features 104 are made of a dielectric material. The dielectric material may include silicon oxide, silicon nitride, silicon oxynitride, fluoride-doped silicate glass (FSG), low-K dielectric material, another suitable material, or a combination thereof.

In some embodiments, a dielectric material layer is deposited over the semiconductor substrate 100. The dielectric material layer covers the fin structures 102 and fills the recesses between the fin structures 102. In some embodiments, the dielectric material layer is deposited using a chemical vapor deposition (CVD) process, a flowable chemical vapor deposition (FCVD) process, an atomic layer deposition (ALD) process, a spin-on process, another applicable process, or a combination thereof.

In some embodiments, a planarization process is performed afterwards to thin the dielectric material layer until the fin structures 102 are exposed. As a result, the isolation features 104 are formed. In some embodiments, top surfaces of the fin structures 102 are substantially coplanar with top surfaces of the isolation features 104. The planarization process may include a chemical mechanical polishing (CMP) process, a grinding process, an etching process, another applicable process, or a combination thereof.

Figures 1, 1B, 2:
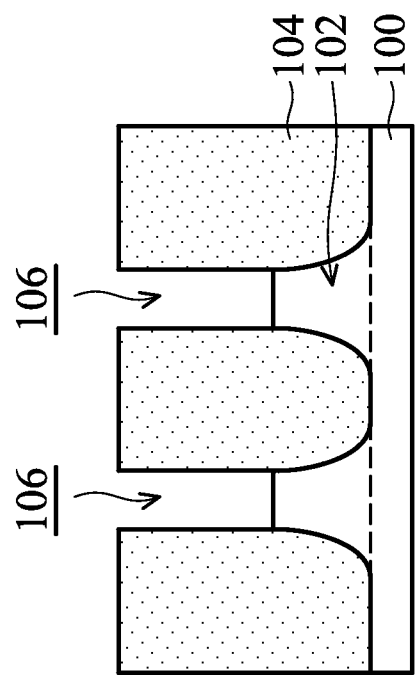
Figures 1, 1B:
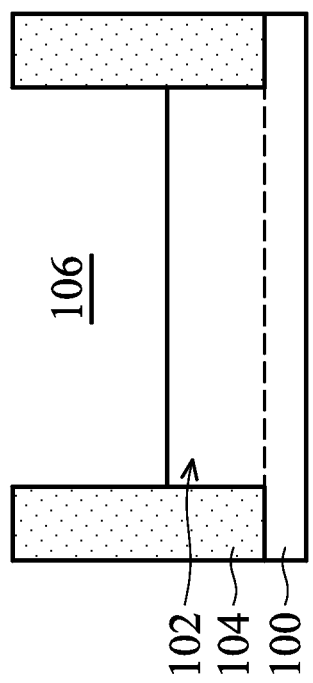

As shown in FIGS. 1B-1 and 1B-2, the fin structures 102 are recessed to form recesses 106, in accordance with some embodiments. The recesses 106 may be a number of trenches that extend along directions parallel to each other. In some embodiments, an etching process is performed to remove upper portions of the fin structures 102. As a result, the recesses 106 are formed on the fin structures 102 that are remained and between the isolation features 104.

Figures 1, 1C, 2:
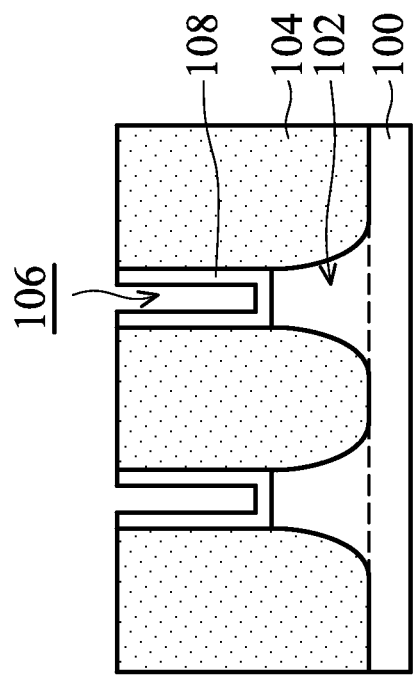
Figures 1, 1C:
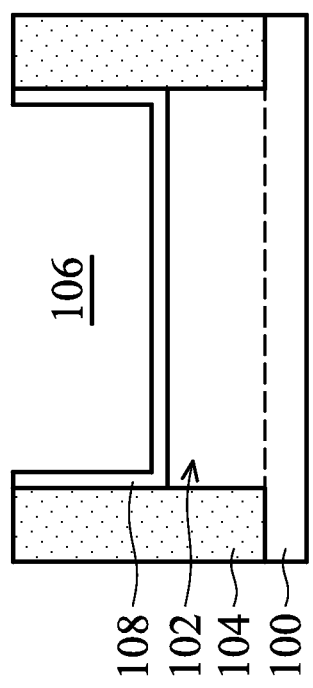

As shown in FIGS. 1C-1 and 1C-2, a barrier layer 108 is deposited over the isolation features 104 and sidewalls and bottoms of the recesses 106, in accordance with some embodiments. The barrier layer 108 may be used to prevent or reduce diffusion between the fin structures 102 and a subsequently formed semiconductor material. Therefore, current leakage may be prevented or reduced. In some embodiments, the barrier layer 108 is conformally formed over the sidewalls and bottoms of the recesses 106.

In some embodiments, the barrier layer 108 is a carbon-containing layer. The barrier layer 108 may be made of carbon, silicon carbide, silicon germanium carbide, another suitable barrier material, or a combination thereof. In some embodiments, the barrier layer 108 is deposited using a selective epitaxial growth (SEG) process, a CVD process (e.g., a vapor-phase epitaxy (VPE) process, a low-pressure chemical vapor deposition (LPCVD) process, or an ultra-high vacuum CVD (UHV-CVD) process), a molecular beam epitaxy process, another applicable process, or a combination thereof. The reaction gas used for growing the barrier layer 108 may include $SiH_3CH_3$ or another suitable gas.

As shown in FIGS. 1D-1 and 1D-2, fin structures 110 are formed over the barrier layer 108, in accordance with some embodiments. In some embodiments, the fin structures 110 are made of a germanium-containing material. The fin structures may be made of silicon germanium or germanium. The fin structures 110 made of the germanium-containing material have higher carrier mobility than silicon fin structures. Device performance may therefore be improved.

In some embodiments, the fin structures 110 are in direct contact with the barrier layer 108. The barrier layer 108 may prevent germanium in the fin structures 110 from entering the fin structures 102 (or the semiconductor substrate 100) under the barrier layer 108 and from entering the isolation features 104. Therefore, current leakage may be prevented or reduced significantly.

In some embodiments, the fin structures 110 are formed using a selective epitaxial growth (SEG) process, a CVD process (e.g., a vapor-phase epitaxy (VPE) process, a low-pressure chemical vapor deposition (LPCVD) process, or an ultra-high vacuum CVD (UHV-CVD) process), a molecular beam epitaxy process, another applicable process, or a combination thereof. The reaction gas used for growing the fin structures 110 may include $SiH_4$, $Si_2H_6$, $GeH_4$, another suitable gas, or a combination thereof. In some embodiments, the fin structures 110 and the barrier layer 108 are grown in-situ in the same process chamber.

In some embodiments, one (or more) semiconductor material is epitaxially grown over the barrier layer 108 to fill the recesses 106. Afterwards, a planarization process, such as a CMP process, may be performed to remove the portion of the semiconductor material that is outside of the recesses 106. As a result, the fin structures 110 are formed. In some embodiments, the top surfaces of the fin structures 110, the barrier layer 108, and the isolation features 104 are substantially coplanar with each other.

Figures 1, 1E:
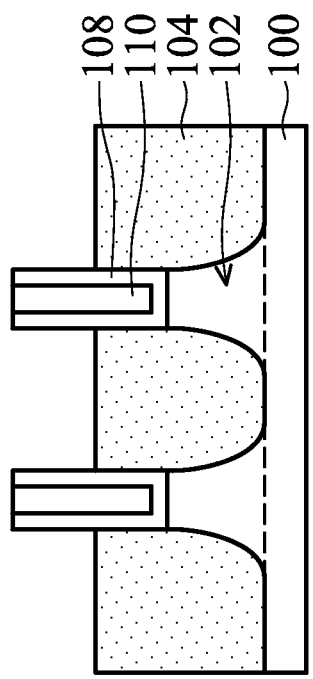
Figures 1, 1E, 2:
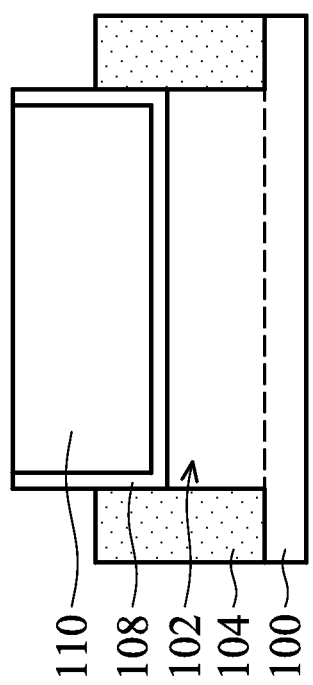

As shown in FIGS. 1E-1 and 1E-2, the isolation features 104 are recessed such that portions of the barrier layer 108 and the fin structures 110 protrude from the isolation features 104, in accordance with some embodiments. In some embodiments, an etching process is used to remove upper portions of the isolation features 104. In some embodiments, the remaining portion of the isolation features 104 still surround lower portions of the barrier layer 108 and the fin structures 110, as shown in FIGS. 1E-1 and 1E-2.

Figures 1, 1F:
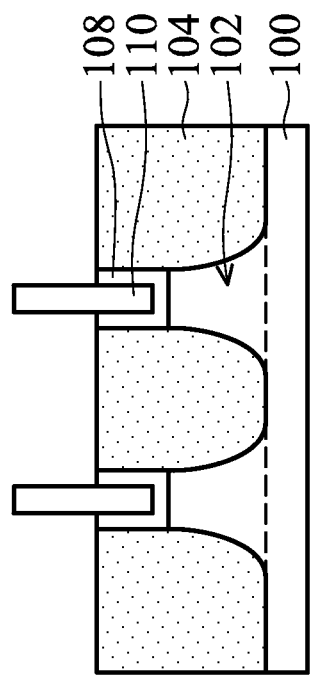
Figures 1, 1F, 2:
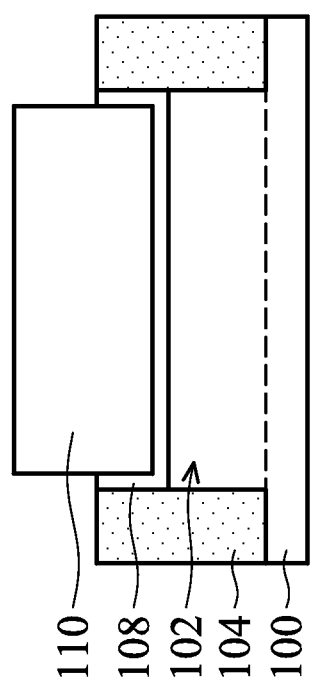

Afterwards, portions of the barrier layer 108 that are not covered by the isolation features 104 are removed to expose the fin structures 110, as shown in FIGS. 1F-1 and 1F-2 in accordance with some embodiments. In some embodiments, the barrier layer 108 is partially removed using an etching process.

Figures 1, 1G:
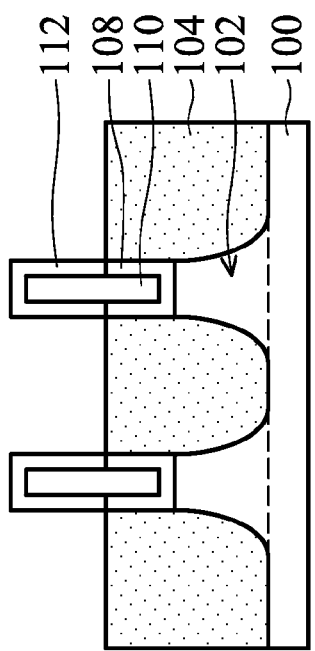
Figures 1, 1G, 2:
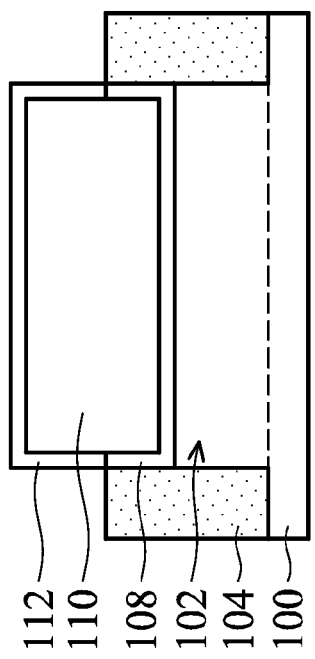

As shown in FIGS. 1G-1 and 1G-2, blocking layers 112 are formed over the fin structures 110, in accordance with some embodiments. The blocking layers 112 may be used to prevent or reduce germanium in the fin structures 110 from entering a gate stack that will be formed over the fin structures 110. In some embodiments, the blocking layers 112 are semiconductor blocking layers that are made of one or more semiconductor materials. In some embodiments, the blocking layers 112 are made of silicon. In some embodiments, the blocking layers 112 are made of single-crystalline silicon.

In some embodiments, the blocking layers 112 are formed conformally on the fin structures 110. In some embodiments, the blocking layers 112 are formed using a selective epitaxial growth (SEG) process, a CVD process (e.g., a vapor-phase epitaxy (VPE) process, a low-pressure chemical vapor deposition (LPCVD) process, or an ultra-high vacuum CVD (UHV-CVD) process), a molecular beam epitaxy process, another applicable process, or a combination thereof. In some embodiments, the blocking layers 112 are deposited at a relatively low temperature to prevent causing damage to the fin structures 112. In some embodiments, the blocking layer 112 is deposited at a temperature in a range from about 300 degrees C. to about 600 degrees C. In some other embodiments, the blocking layer 112 is deposited at a temperature in a range from about 200 degrees C. to about 500 degrees C.

As shown in FIGS. 1H-1 and 1H-2, a gate stack 114 is formed over the blocking layers 112, in accordance with some embodiments. In some embodiments, the gate stack 114 covers multiple fin structures 112 and allows the gate to control the channel regions from multiple sides. In some embodiments, the gate stack 114 includes a gate electrode 116 and a hard mask 118. In some embodiments, spacer elements 120 are formed over sidewalls of the gate stack 114. The spacer elements 120 may be made of silicon nitride, silicon oxynitride, silicon carbide, silicon carbon nitride, another suitable material, or a combination thereof.

The hard mask 118 may serve as an etching mask during the formation of the gate electrode 116. In some embodiments, the hard mask 118 is made of silicon oxide, silicon nitride, silicon oxynitride, silicon carbide, silicon carbon nitride, another suitable material, or a combination thereof. In some embodiments, the hard mask 118 has a multi-layer structure.

In some embodiments, the gate electrode 116 includes polysilicon, a metal material, another suitable conductive material, or a combination thereof. In some embodiments, the gate electrode 116 is a dummy gate electrode layer and will be replaced with another conductive material such as a metal material. The dummy gate electrode layer is made of, for example, polysilicon.

In some embodiments, a gate electrode layer and a hard mask layer are deposited over the blocking layers 112. Afterwards, a photolithography process and an etching process are performed to pattern the hard mask layer into the hard mask 118. The gate electrode layer is etched afterwards through openings defined by the hard mask 118. As a result, the gate electrode 116 is formed.

As shown in FIGS. 1I-1 and 1I-2, the portions of the blocking layers 112, that are not covered by the gate stack 114, are oxidized using an oxidation process 122, in accordance with some embodiments. As a result, semiconductor oxide layers 113 are formed. In some embodiments, the blocking layers 112 are made of silicon, and the semiconductor oxide layers 113 are made of silicon oxide. In some embodiments, the oxidation process 122 is performed under an atmosphere containing oxygen and/or water vapor. In some embodiments, the oxidation process 122 is an oxygen plasma process. In some embodiments, the oxidation process 122 is performed at a temperature lower than about 600 degrees C. to prevent damage to the fin structures 110.

Afterwards, the semiconductor oxide layers 113 are removed to expose the portions of the fin structures 110 that are not covered by the gate stack 114, as shown in FIGS. 1J-1 and 1J-2 in accordance with some embodiments. In some embodiments, an etching process is performed to remove the semiconductor oxide layers 113. The portions of the blocking layers 112 that are not oxidized to form the semiconductor oxide layers 113 remain between the gate stack 114 and the fin structures 112.

Many variations and/or modifications can be made to embodiments of the disclosure. In some embodiments, the blocking layer 112 is not formed. The blocking layer 112 is replaced by a gate dielectric layer. In these cases, the oxidation process 122 may not be performed. The portions of the gate dielectric layer that are not covered by the gate stack 114 may be removed using an etching process to expose the fin structures 110.

Figures 1, 1K, 2:
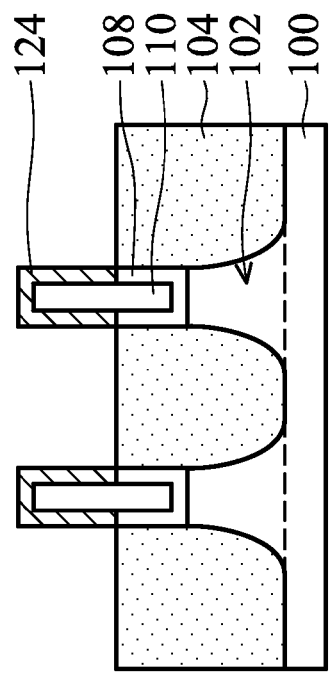
Figures 1, 1K:
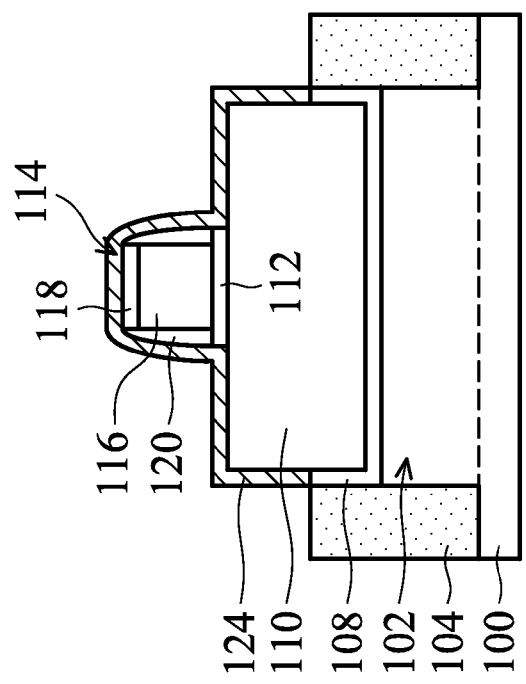

As shown in FIGS. 1K-1 and 1K-2, a contact layer 124 is formed over the fin structures 110, the spacer elements 120, and the gate stack 114, in accordance with some embodiments. The contact layer 124 may serve as an interface layer between the fin structure 110 and a conductive contact which will be formed later. The contact layer 124 may also serve as a dopant source layer that provides dopants to improve performance of the semiconductor device structure. In some embodiments, the contact layer 124 is directly on the fin structures 110. In other words, the contact layer 124 and the fin structures 110 are in direct contact with each other.

In some embodiments, the contact layer 124 is made of a conductive material. For example, the contact layer 124 includes a metal material. In some embodiments, the contact layer 124 is made of tin (Sn), lead (Pd), another suitable material, or a combination thereof. In some embodiments, the contact layer 124 is deposited using a PVD process, an electroplating process, a CVD process, another applicable process, or a combination thereof. In some embodiments, a photolithography process and an etching process are performed to pattern the contact layer 124. For example, the portions of the contact layer 124 that are originally positioned over the isolation features 104 are removed.

Figures 1, 1L:
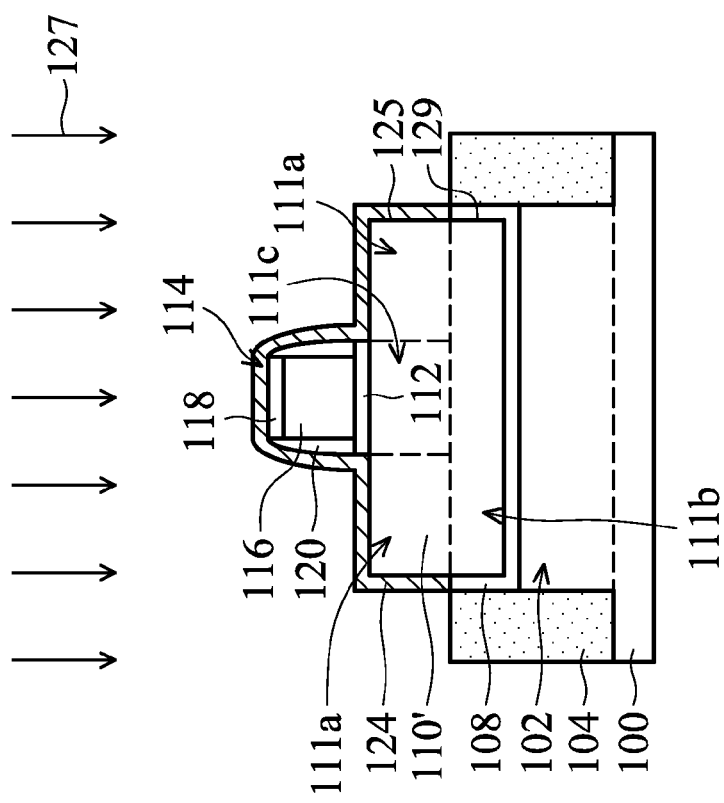
Figures 1, 1L, 2:
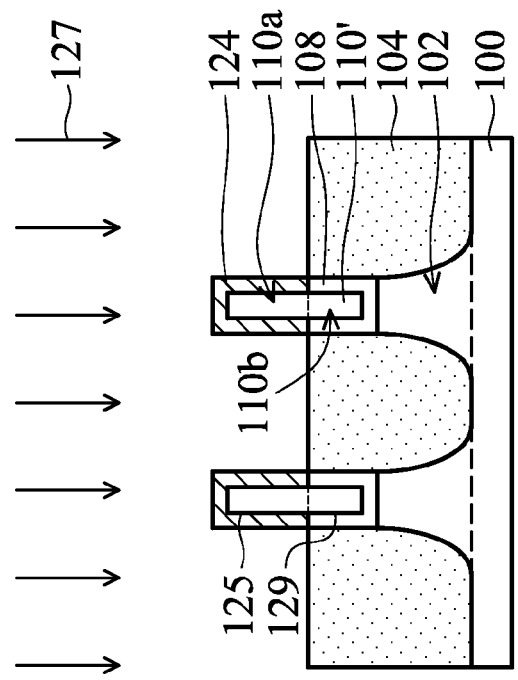

As shown in FIGS. 1L-1 and 1L-2, a thermal operation 127 is performed to drive material of the contact layer 124 into the fin structures 110 to form doped fin structures 110', in accordance with some embodiments. As mentioned above, the contact layer 124 may serve as a dopant source layer. In some embodiments, after the thermal operation 127, atoms and/or ions (such as tin) are driven into the fin structures 110 to form the doped fin structures 110'.

The thermal operation 127 should not be performed at too high a temperature or performed for too long a period. Therefore, the fin structures 110 (or the doped fin structures 110') are prevented from being damaged. In some embodiments, the thermal operation 127 is performed at a temperature in a range from about 100 degrees C. to about 400 degrees C. for about 1 second to about 10 seconds. In some other embodiments, the thermal operation 127 is performed at a temperature in a range from about 500 degrees C. to about 600 degrees C. for about $10^{-6}$ seconds to about $10^{-3}$ seconds. In some embodiments, the thermal operation 127 is performed using a laser irradiation or another applicable method.

As shown in FIGS. 1L-1 and 1L-2, each of the doped fin structures 110' includes upper portions 111a and an intermediate portion 111c between the upper portions 111a. Each of the doped fin structures 110' also includes a lower portion 111b below the upper portions 111a and the intermediate portion 111c. As shown in FIGS. 1L-1 and 1L-2, the lower portion 111b is surrounded by the isolation features 104. The intermediate portion 111b is the portion that is covered by the gate stack 114 and is not surrounded by the isolation features 104. In some embodiments, the intermediate portion 111c includes a channel region that is near the gate stack 114. The upper portions 111a are the portions that are not covered by the gate stack 114 and are not surrounded by the isolation features 104.

In some embodiments, the upper portions 111a of the doped fin structures 110' include silicon, germanium, and tin (or/and lead). In some other embodiments, the upper portions 111a of the doped fin structures 110' include germanium and tin (or/and lead). In some embodiments, the tin (or/and lead) in the upper portions 111a comes from the contact layer 124 after the thermal operation 127. For example, the tin (or/and lead) in the contact layer 124 diffuses into the fin structures thereunder during the thermal operation 127. In some embodiments, the upper portions 111a serve as source/drain features. The tin (or/and lead) in the upper portions 111a may improve the electrical properties.

In some embodiments, the concentration of tin (or lead) in each of the upper portions 111a is not uniform. In some embodiments, the concentration of tin (or lead) in the upper portion 111a gradually decreases along a direction away from an interface 125 between the doped fin structure 110' and the contact layer 124. Embodiments of the disclosure have many variations. In some other embodiments, the concentration of tin in each of the upper portions 111a is substantially uniform.

In some embodiments, a small amount of tin (or/and lead) also diffuses into the intermediate portion 111c. In some cases, the carrier mobility of the channel region may thus be increased. The performance of the semiconductor device structure may be improved.

In some embodiments, germanium in the doped fin structure 110' diffuses into the contact layer 124 during the thermal operation 127. In some embodiments, the concentration of germanium in the contact layer 124 is not uniform. In some embodiments, the concentration of germanium in the contact layer 124 gradually decreases along a direction away from the interface 125 between the doped fin structure 110' and the contact layer 124. However, it should be appreciated that many variations and/or modifications can be made to embodiments of the disclosure. In some other embodiments, the concentration of germanium in the contact layer 124 is substantially uniform.

In some embodiments, germanium in the doped fin structure 110' diffuses into the barrier layer 108 during the thermal operation 127. In some embodiments, the concentration of germanium in the barrier layer 108 is not uniform. In some embodiments, the concentration of germanium in the barrier layer 108 gradually decreases along a direction away from an interface 129 between the doped fin structure 110' and the barrier layer 108. However, it should be appreciated that many variations and/or modifications can be made to embodiments of the disclosure. In some other embodiments, the concentration of germanium in the barrier layer 108 is substantially uniform.

In some embodiments, carbon in the barrier layer 108 diffuses into the lower portion 111b of the doped fin structure 110' during the thermal operation 127. In some embodiments, the concentration of carbon in the lower portion 111b is not uniform. In some embodiments, the concentration of carbon in the lower portion 111b gradually decreases along a direction away from the interface 129 between the doped fin structure 110' and the barrier layer 108. However, it should be appreciated that many variations and/or modifications can be made to embodiments of the disclosure. In some other embodiments, the concentration of carbon in the lower portion 111b is substantially uniform.

Figures 1, 1M, 2:
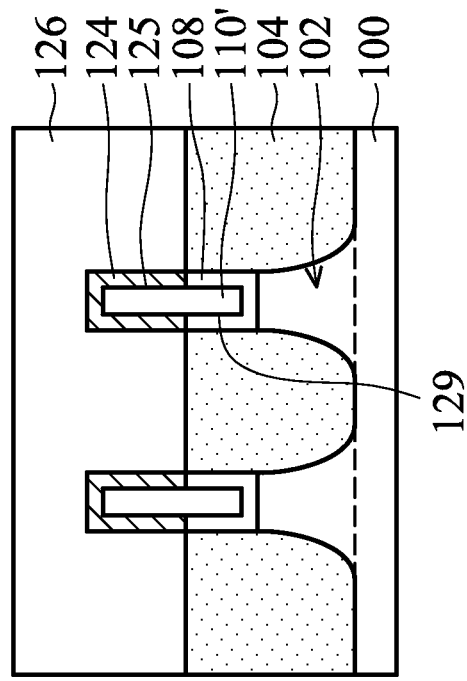
Figures 1, 1M:
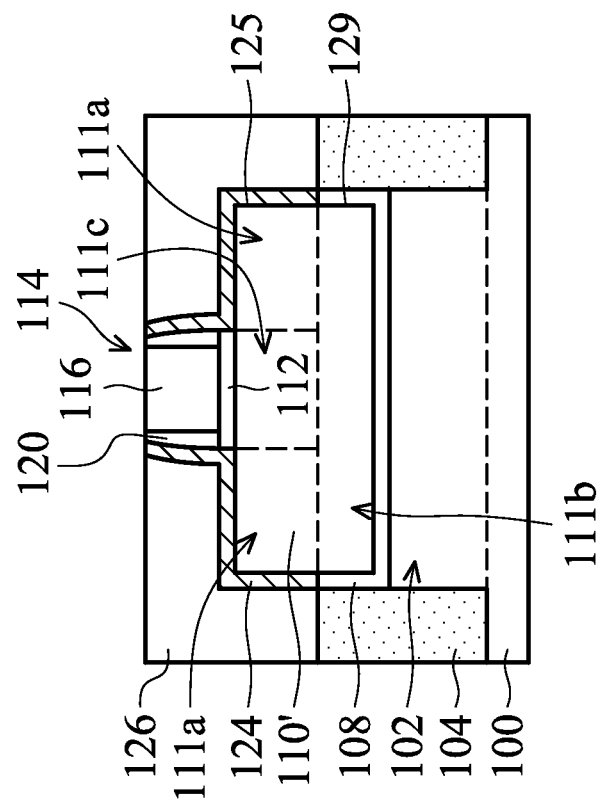

As shown in FIGS. 1M-1 and 1M-2, a dielectric layer 126 is formed over the isolation features 104 and the contact layer 124, in accordance with some embodiments. Afterwards, a planarization process is performed to thin the dielectric layer 126 until the gate electrodes 116 are exposed. The planarization process may include a chemical mechanical polishing (CMP) process, an etching process, a grinding process, another applicable process, or a combination thereof. In some embodiments, the hard mask 106 is also removed during the planarization process.

Figures 1, 1N:
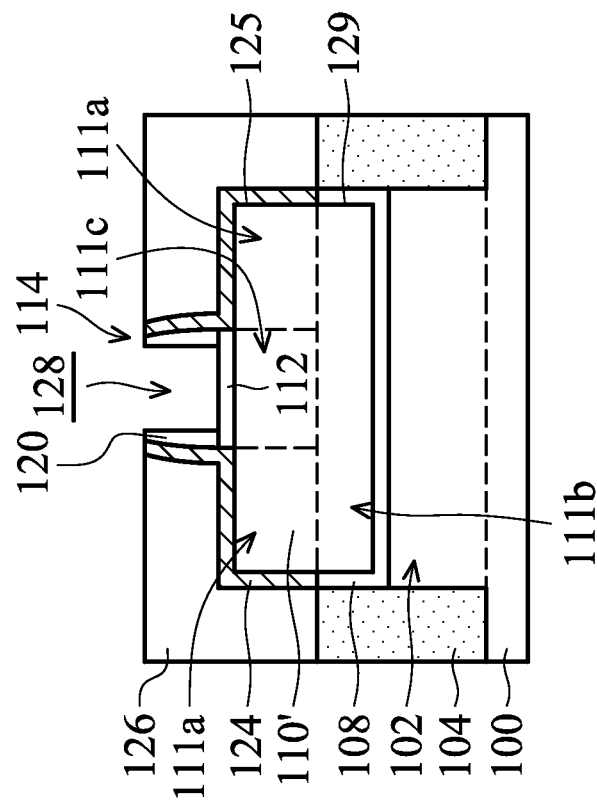
Figures 1, 1N, 2:
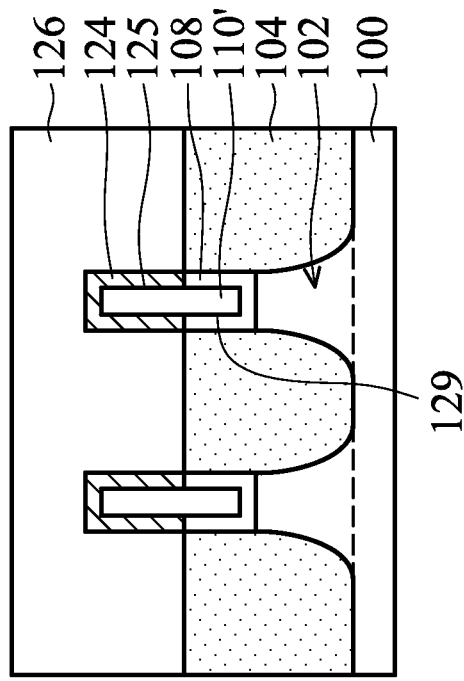
Figures 2, 10:
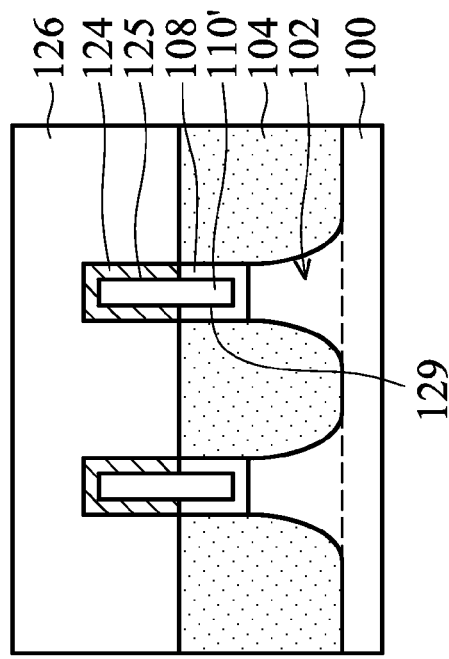
Figures 1, 10:
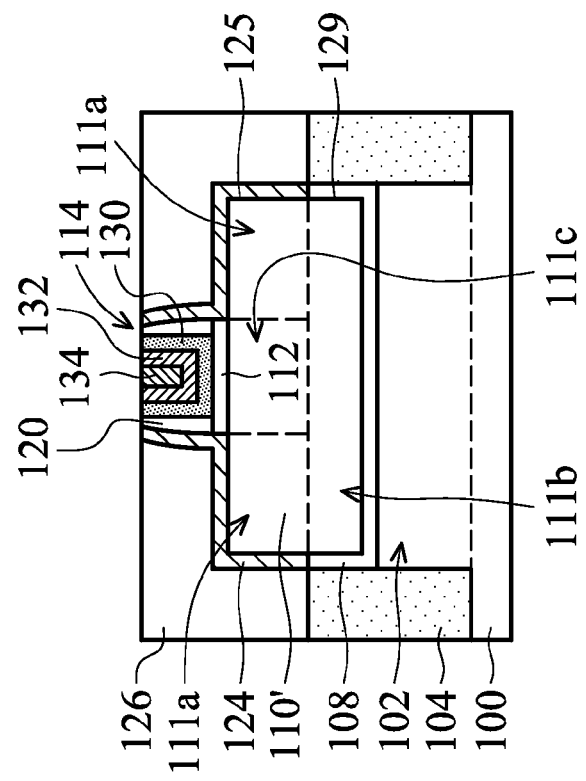

In some embodiments, the gate electrode 116 is a dummy gate electrode. As shown in FIGS. 1N-1 and 1N-2, the gate electrode 116 is removed to form a recess 128 between the spacer elements 120, in accordance with some embodiments. In some embodiments, the recess 128 is a trench. In some embodiments, the recess 128 extends along a direction that is substantially perpendicular to an extending direction of the doped fin structures 110'. In some embodiments, the gate electrode 116 is removed using an etching process.

As shown in FIGS. 1O-1 and 1O-2, a gate dielectric layer 130 and a work function layer 132 are formed in the recess 128, in accordance with some embodiments. In some embodiments, a metal filling layer 134 is also formed in the recess 128. The gate dielectric layer 130, the work function layer 132, and the metal filling layer 134 may together form a metal gate stack. The work function layer 132 and the metal filling layer 134 may together form a metal gate electrode. As shown in FIG. 1Q-1, the blocking layer 112, such as a silicon layer, is between the metal gate stack and the doped fin structures 110'. The blocking layer 112 may prevent germanium in the doped fin structures 110' from entering the metal gate stack. The blocking layer 112 may also serve as a good interfacial layer between the doped fin structures 110' and the gate dielectric layer 130. Therefore, the performance of the semiconductor device structure is improved.

In some embodiments, the gate dielectric layer 130 is a high-k dielectric layer. The high-k dielectric layer may be made of hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 130 is deposited using an ALD process or another applicable process.

Afterwards, the work function layer 132 is deposited over the gate dielectric layer 130, in accordance with some embodiments. In some embodiments, the work function layer 132 includes multiple sub-layers. In some embodiments, these sub-layers are made of different materials. In some other embodiments, these sub-layers are made of the same material. The work function layer 132 is used to provide desired work function for transistors to enhance device performance including improved threshold voltage. In the embodiments of forming an NMOS transistor, the work function layer 132 can be an n-type metal layer capable of providing a work function value suitable for the device, such as equal to or less than about 4.5 eV. The n-type metal layer may include metal, metal carbide, metal nitride, or a combination thereof. For example, the n-type metal layer includes titanium nitride, tantalum, tantalum nitride, other suitable materials, or a combination thereof.

On the other hand, in the embodiments of forming a PMOS transistor, the work function layer 132 can be a p-type metal layer capable of providing a work function value suitable for the device, such as equal to or greater than about 4.8 eV. The p-type metal layer may include metal, metal carbide, metal nitride, other suitable materials, or a combination thereof. For example, the p-type metal includes tantalum nitride, tungsten nitride, titanium, titanium nitride, other suitable materials, or a combination thereof.

The work function layer 132 may also be made of hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer 132 may be tuned to adjust the work function level. For example, a titanium nitride layer may be used as a p-type metal layer or an n-type metal layer, depending on the thickness and/or the compositions of the titanium nitride layer.

Afterwards, the metal filling layer 134 is deposited over the work function layer 132 to fill the recess 128, in accordance with some embodiments. In some embodiments, the metal filling layer 134 is made of aluminum, tungsten, copper, another suitable material, or a combination thereof. In some embodiments, the metal filling layer 134 is deposited using a PVD process, a plating process, a CVD process, another applicable process, or a combination thereof.

Afterwards, a planarization process is performed to remove the portions of the gate dielectric layer 130, the work function layer 132, and the metal filling layer 134 outside of the recess 128, in accordance with some embodiments. The remaining portions of the work function layer 132 and the metal filling layer 134 together form the metal gate electrode. The planarization process may include a CMP process, a grinding process, an etching process, another applicable process, or a combination thereof.

Figures 1, 1P, 2:
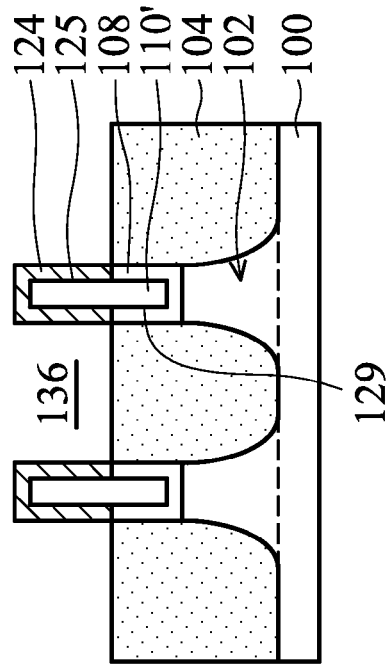
Figures 1, 1P:
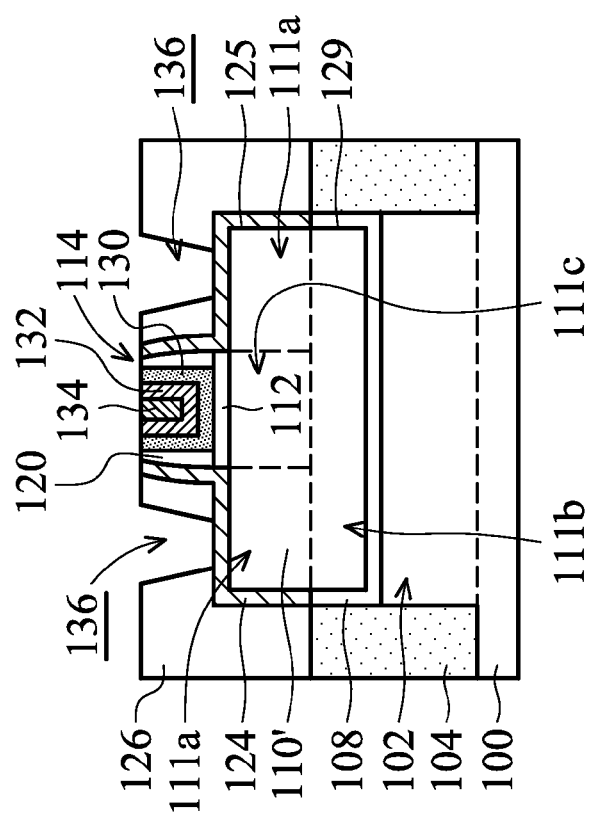
Figures 1, 1Q, 2:
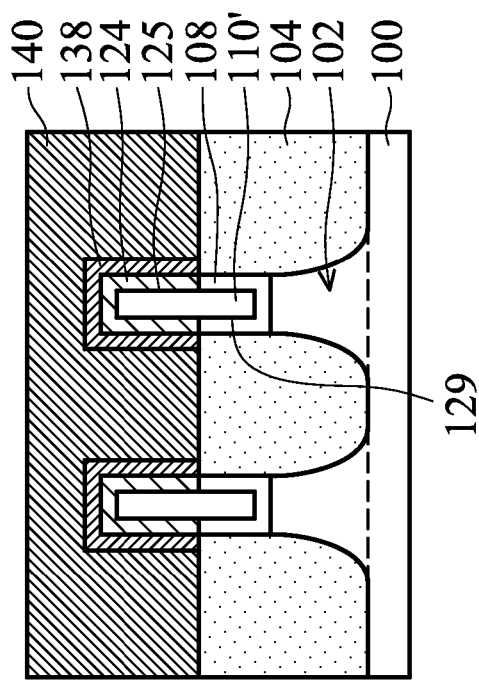
Figures 1, 1Q:
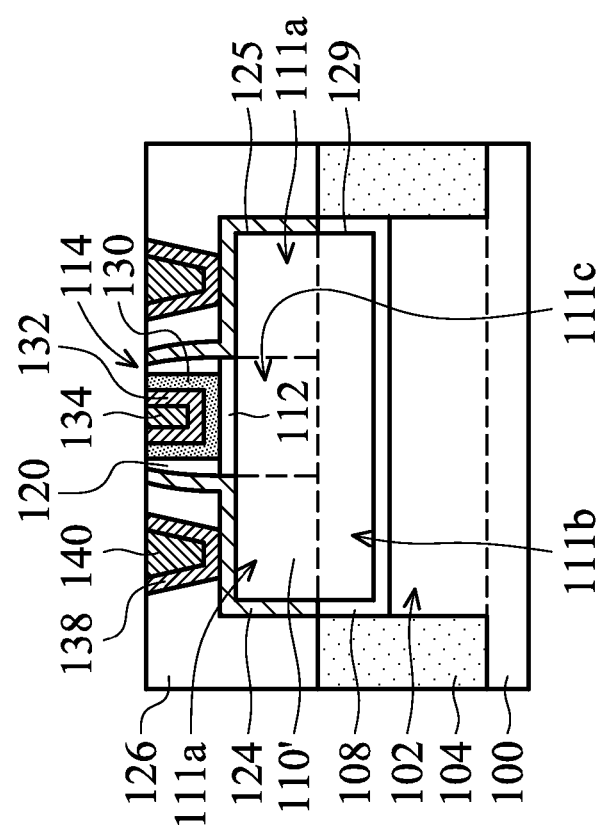
Figure 2:
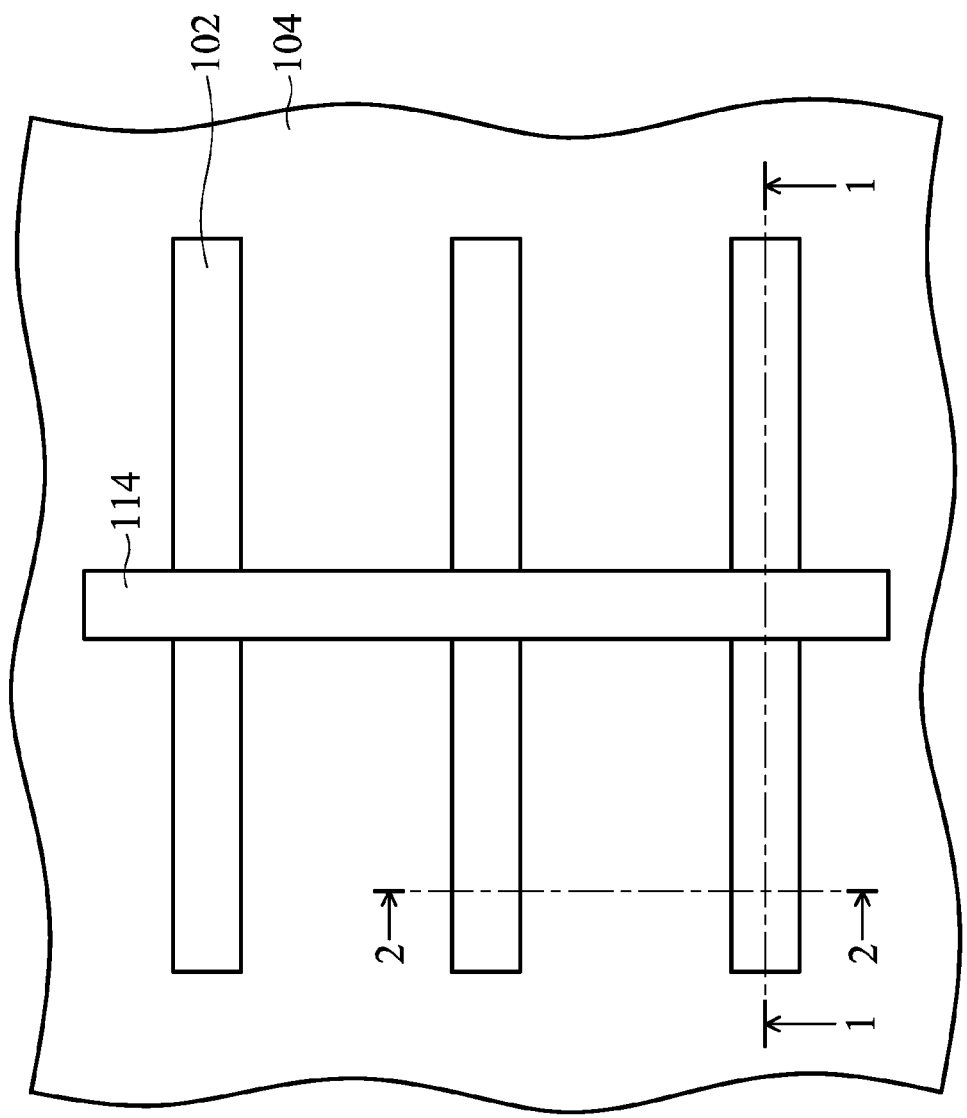

As shown in FIGS. 1P-1 and 1P-2, contact openings 136 are formed in the dielectric layer 126 to expose the contact layer 124, in accordance with some embodiments. In some embodiments, one or more photolithography processes and one or more etching processes are performed to form the contact openings 136.

As shown in FIGS. 1Q-1 and 1Q-2, a barrier layer 138 is deposited over sidewalls and bottoms of the contact openings 136, and conductive contacts 140 are formed to fill the contact openings 136, in accordance with some embodiments. The conductive contacts 140 are in electrical contact with the contact layer 124, and the contact layer 124 is electrically connected to the upper portions 111*a*. In some embodiments, the upper portions 111*a* serve as source/drain features. In these cases, the conductive contacts 140 are used as contacts that are electrically connected to the source/drain features.

The barrier layer 138 may be used to protect the dielectric layer 126 from diffusion of a metal material from the conductive contacts 140. The barrier layer 138 may also serve as an adhesion layer between the conductive contacts 140 and the dielectric layer 126. In some embodiments, the barrier layer 138 is made of titanium nitride, tantalum nitride, titanium, tungsten nitride, another suitable material, or a combination thereof. In some embodiments, the barrier layer 138 is deposited using a PVD process, a CVD process, an ALD process, an electroless plating process, another applicable process, or a combination thereof.

In some embodiments, the conductive contacts 140 is made of copper, aluminum, tungsten, titanium, nickel, gold, platinum, another suitable conductive material, or a combination thereof. In some embodiments, the conductive contacts 140 is deposited using an electrochemical plating process, an electroless plating process, a PVD process, a CVD process, a spin-on process, another applicable process, or a combination thereof.

Embodiments of the disclosure form a FinFET device including many material layers made of elements of group IV. A germanium-containing fin structure is formed to increase the carrier mobility of a channel region. A carbon-containing layer is formed between the germanium-containing fin structure and a semiconductor substrate thereunder to prevent germanium from entering the semiconductor substrate. Therefore, current leakage is significantly reduced or prevented. A contact layer made of tin and/or lead is formed between a conductive contact and the germanium-containing fin structure. A thermal operation is performed to drive tin and/or lead into the germanium-containing fin structure. Electrical properties are therefore improved. A semiconductor blocking layer is formed between the germanium-containing fin structure and a gate stack to prevent germanium diffusion into the gate stack. Reliability and performance of the FinFET device are greatly improved.

In accordance with some embodiments, a semiconductor device structure is provided. The semiconductor device structure includes a semiconductor substrate and a fin structure over the semiconductor substrate. The semiconductor device structure also includes a gate stack over a portion of the fin structure, and the fin structure includes an intermediate portion under the gate stack and upper portions besides the intermediate portion. The semiconductor device structure further includes a contact layer over the fin structure. The contact layer includes a metal material, and the upper portions of the fin structure also include the metal material.

In accordance with some embodiments, a semiconductor device structure is provided. The semiconductor device structure includes a semiconductor substrate and a germanium-containing fin structure over the semiconductor substrate. The semiconductor device structure also includes a metal gate stack over a portion of the germanium-containing fin structure. The semiconductor device structure further includes a semiconductor blocking layer between the germanium-containing fin structure and the metal gate stack.

In accordance with some embodiments, a method for forming a semiconductor device structure is provided. The method includes forming a fin structure over a semiconductor substrate and forming a gate stack over the fin structure. The method also includes forming a contact layer over a portion of the fin structure, and the contact layer includes a metal material. The method further includes driving a portion of the metal material from the contact layer into the fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a semiconductor substrate;
    a fin structure over the semiconductor substrate;
    a gate stack over the fin structure, wherein the fin structure includes an intermediate portion under the gate stack, upper portions besides the intermediate portion, and a lower portion below the upper portions and the intermediate portion;
    a contact layer over the fin structure, wherein the contact layer comprises a metal material, and the upper portions of the fin structure also comprise the metal material; and
    a carbon-containing layer between the semiconductor substrate and the fin structure, wherein the carbon-containing layer surrounds the lower portion of the fin structure.

2. The semiconductor device structure as claimed in claim 1, wherein the metal material comprises tin, lead, or a combination thereof.

3. The semiconductor device structure as claimed in claim 1, wherein a concentration of the metal material in each of the upper portions gradually decreases along a direction away from an interface between the fin structure and the contact layer.

4. The semiconductor device structure as claimed in claim 1, wherein the fin structure comprises germanium.

5. The semiconductor device structure as claimed in claim 4, wherein the contact layer further comprises germanium.

6. The semiconductor device structure as claimed in claim 5, wherein a concentration of germanium in the contact layer gradually decreases along a direction away from an interface between the fin structure and the contact layer.

7. The semiconductor device structure as claimed in claim 1, wherein the lower portion of the fin structure further comprises carbon.

8. The semiconductor device structure as claimed in claim 7, wherein a concentration of carbon in the lower portion gradually decreases along a direction away from an interface between the fin structure and the carbon-containing layer.

9. The semiconductor device structure as claimed in claim 1, further comprising a semiconductor blocking layer between the intermediate portion of the fin structure and the gate stack.

10. The semiconductor device structure as claimed in claim 1, wherein the contact layer surrounds the upper portions of the fin structure.

11. A semiconductor device structure, comprising:
   a semiconductor substrate;
   a germanium-containing fin structure over the semiconductor substrate;
   a metal gate stack over a portion of the germanium-containing fin structure; and
   a carbon-containing layer between the semiconductor substrate and the germanium-containing fin structure, wherein the carbon-containing layer surrounds a lower portion of the germanium-containing fin structure.

12. The semiconductor device structure as claimed in claim 11, further comprising a contact layer over the germanium-containing fin structure, wherein the contact layer comprises a metal material, and another portion of the germanium-containing fin structure that is under the contact layer also comprises the metal material.

13. The semiconductor device structure as claimed in claim 12, wherein the metal material comprises tin, lead, or a combination thereof.

14. The semiconductor device structure as claimed in claim 11, further comprising:
   a dielectric layer over the contact layer; and
   a conductive contact in the dielectric layer and is in electrical contact with the contact layer.

15. The semiconductor device structure as claimed in claim 11, further comprising a semiconductor blocking layer between the germanium-containing fin structure and the metal gate stack, wherein the semiconductor blocking layer comprises a semiconductor material.

16. A method for forming a semiconductor device structure, comprising:
   forming a carbon-containing layer over a semiconductor substrate;
   forming a fin structure over the semiconductor substrate, wherein the carbon-containing layer surrounds a lower portion of the fin structure;
   forming a gate stack over the fin structure;
   forming a contact layer over the fin structure, wherein the contact layer comprises a metal material; and
   driving a portion of the metal material from the contact layer into the fin structure.

17. The method for forming a semiconductor device structure as claimed in claim 16, wherein the formation of the carbon-containing layer over the semiconductor substrate is performed before the fin structure is formed.

18. The method for forming a semiconductor device structure as claimed in claim 16, wherein the portion of the metal material is driven into the fin structure using a thermal operation.

19. The method for forming a semiconductor device structure as claimed in claim 16, further comprising forming a semiconductor blocking layer over the fin structure before the gate stack is formed.

20. The method for forming a semiconductor device structure as claimed in claim 19, further comprising:
   oxidizing a portion of the semiconductor blocking layer not covered by the gate stack; and
   removing the oxidized portion of the semiconductor blocking layer before the contact layer is formed.

* * * * *